(12) United States Patent
Risaki

(10) Patent No.: US 9,343,457 B2
(45) Date of Patent: May 17, 2016

(54) SEMICONDUCTOR DEVICE

(71) Applicant: SEIKO INSTRUMENTS INC., Chiba-shi, Chiba (JP)

(72) Inventor: Tomomitsu Risaki, Chiba (JP)

(73) Assignee: STI Semiconductor Corporation (JP)

( * ) Notice: Subject to any disclaimer, the term of this patent is extended or adjusted under 35 U.S.C. 154(b) by 0 days.

(21) Appl. No.: 14/771,547

(22) PCT Filed: Feb. 14, 2014

(86) PCT No.: PCT/JP2014/053410
§ 371 (c)(1),
(2) Date: Aug. 31, 2015

(87) PCT Pub. No.: WO2014/136548
PCT Pub. Date: Sep. 12, 2014

(65) Prior Publication Data
US 2016/0020200 A1   Jan. 21, 2016

(30) Foreign Application Priority Data

Mar. 6, 2013  (JP) .................................. 2013-044168

(51) Int. Cl.
*H01L 23/62* (2006.01)
*H01L 27/02* (2006.01)
*H01L 23/528* (2006.01)
*H01L 23/522* (2006.01)

(52) U.S. Cl.
CPC ............ *H01L 27/027* (2013.01); *H01L 23/528* (2013.01); *H01L 23/5228* (2013.01)

(58) Field of Classification Search
CPC .. H01L 27/027; H01L 23/528; H01L 23/5228
See application file for complete search history.

(56) References Cited

U.S. PATENT DOCUMENTS

| | | | | |
|---|---|---|---|---|
| 5,977,595 A * | 11/1999 | Ham | .................... | H01L 27/0288 257/358 |
| 6,147,538 A * | 11/2000 | Andresen | ................. | H03K 5/08 327/309 |
| 6,258,672 B1 * | 7/2001 | Shih | ......................... | H01L 27/27 438/275 |
| 7,646,063 B1 * | 1/2010 | Boyd | ...................... | H01L 27/27 257/355 |
| 2004/0173795 A1 * | 9/2004 | Moon | ............... | H01L 29/41733 257/59 |
| 2009/0166681 A1 * | 7/2009 | Tiebout | ............... | H01L 23/4824 257/206 |
| 2012/0235702 A1 * | 9/2012 | Huang | ............... | G11C 16/0425 324/762.01 |

OTHER PUBLICATIONS

Abstract, Publication No. 2007-116049, Publication Date May 10, 2007.
International Search Report Mailed Mar. 18, 2014 issued in International Appln. No. PCT/JP2014/053410.

* cited by examiner

*Primary Examiner* — Victor A Mandala
(74) *Attorney, Agent, or Firm* — Adams & Wilks

(57) ABSTRACT

In order to provide a semiconductor device having a high ESD tolerance, a source wiring (32*a*) is formed on a gate (31) and a source (32) in a region of an NMOS transistor (30). The source wiring (32*a*) electrically connects the gate (31), the source (32), and a ground terminal. A drain wiring (33*a*) is formed on a drain (33) in the region of the NMOS transistor (30). The drain wiring (33*a*) electrically connects the drain (33) and a pad (20) serving as an external connection electrode. Moreover, in the region of the NMOS transistor (30), the drain wiring (33*a*) has the same wiring width as the source wiring (32*a*).

2 Claims, 4 Drawing Sheets

PATH 1          PATH 2

SEMICONDUCTOR DEVICE

TECHNICAL FIELD

The present invention relates to a semiconductor device including an ESD protection circuit using an N-channel MOS transistor.

BACKGROUND ART

A semiconductor device formed of a semiconductor integrated circuit includes a pad serving as an external connection electrode. In the vicinity of the pad, an electrostatic discharge (ESD) protection circuit configured to protect an internal circuit of the semiconductor device against ESD is generally arranged. One kind of ESD protection circuits uses a multi-finger N-channel MOS transistor (hereinafter referred to as "NMOS transistor"). In this case, the NMOS transistor has a gate and a source both connected to aground terminal, and a drain connected to a pad and an internal circuit (for example, see Patent Literature 1).

CITATION LIST

Patent Literature

[PTL 1] JP 2007-116049 A

SUMMARY OF INVENTION

Technical Problem

In the technology disclosed in Patent Literature 1, in an ESD protection circuit using an NMOS transistor, a salicide block width between a contact of a drain and a gate electrode is adjusted to improve an ESD tolerance. In this configuration, there is a salicide block between the contact of the drain and the gate electrode, whereas there is no salicide block between a contact of a source and the gate electrode. FIG. 3 is an illustration of an example of a transistor having such a configuration. An NMOS transistor 30 of an ESD protection circuit includes a drain wiring 53a connected to a pad 40 and an internal circuit, and a gate 51 and a source wiring 52a both connected to a ground wiring. As illustrated in FIG. 3, a layout design is generally made so that a wiring width of the drain wiring 53a is larger than a wiring width of the source wiring 52a in a region of an NMOS transistor 50, and hence a resistance value of the drain wiring 53a is lower than a resistance value of the source wiring 52a.

When a positive surge voltage is applied to the pad 40, generated surge current flows from the pad 40 to the ground terminal through the NMOS transistor 50. Specifically, the surge current flows through a resistor typified by the drain wiring 53a, a resistor of a channel region below the gate 51, and a resistor typified by the source wiring 52a in this order. A large number of such current paths exist with respect to the gate width. For example, both of a path 1 and a path 2 of FIG. 3 serve as the current paths.

If the NMOS transistor 50 is equally-divided into five in a channel width direction, resistances of the drain wiring and the source wiring in a length of one of the divided portions are respectively represented by Rd0 and Rs0. Further, it is assumed that when viewed from the drain wiring 53a side (upper side of FIG. 3), the path 1 is a path located at ⅕ of the gate width and the path 2 is a path located at ⅘ of the gate width. Then, resistance components of the path 1 and the path 2 are respectively expressed as follows.

Resistance component of path 1=1$Rd0$+$Rch$+4$Rs0$

Resistance component of path 2=4$Rd0$+$Rch$+1$Rs0$

FIG. 4 is an equivalent circuit diagram of the divided NMOS transistor expressed by those expressions. As illustrated in FIG. 4, for example, the resistance $Rd0$ of the drain wiring includes all of resistance components of a resistance of a wiring metal, a resistance of a contact, a resistance of a drain region, and the like. In this case, "drain wiring width>source wiring width" is established, and hence "$Rd0$<$Rs0$" is established. Accordingly, "resistance component of path 1>resistance component of path 2" is established, which allows the surge current to flow through the path 2 rather than the path 1. That is, the surge current is concentrated on a gate on the source wiring 52a side (lower side of FIG. 3) in each of fingers. Thus, a channel region is liable to be broken around this portion, which leads to low ESD tolerances of the NMOS transistor 50 and the semiconductor device.

The present invention has been made in view of the above-mentioned problem, and provides a semiconductor device having a high ESD tolerance.

Solution to Problem

In order to solve the above-mentioned problem, according to one embodiment of the present invention, there is provided a semiconductor device including an ESD protection circuit using a multi-finger NMOS transistor, the semiconductor device including: the multi-finger NMOS transistor including: a plurality of sources and a plurality of drains alternately arranged on a surface of a semiconductor substrate; a plurality of channel regions each arranged between one of the plurality of sources and one of the plurality of drains; and a gate formed above each of the plurality of channel regions; a source wiring formed on the gate and the plurality of sources in a region of the multi-finger NMOS transistor, for electrically connecting the gate, the plurality of sources, and a ground terminal; and a drain wiring formed on the plurality of drains in the region of the multi-finger NMOS transistor, for electrically connecting the plurality of drains and a pad serving as an external connection electrode, the drain wiring having the same wiring width as the source wiring in the region of the multi-finger NMOS transistor.

Advantageous Effects of Invention

According to the one embodiment of the present invention, the ESD tolerance of the semiconductor device may be increased without increasing the chip size.

DESCRIPTION OF EMBODIMENTS

Now, an embodiment of the present invention is described with reference to the drawings.

Figure 1:
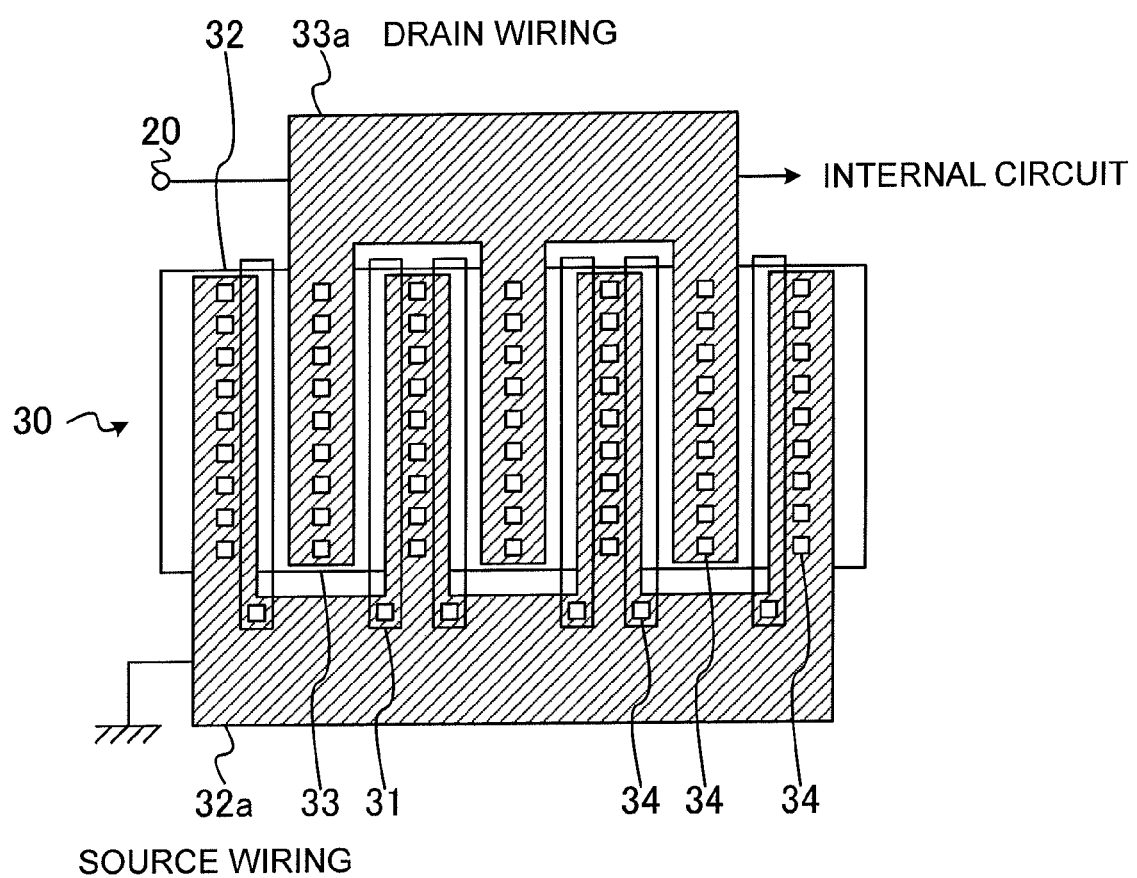
FIG. 1 is a plan view for illustrating an ESD protection circuit using an NMOS transistor in a semiconductor device.

First, a structure of a semiconductor device including an ESD protection circuit using an NMOS transistor is described with reference to FIG. 1. FIG. 1 is a plan view for illustrating the ESD protection circuit using the NMOS transistor.

An NMOS transistor 30 is a multi-finger NMOS transistor, in which a plurality of source regions 32 and a plurality of drain regions 33 are alternately arranged on a surface of a semiconductor substrate. A plurality of channel regions are each arranged between the source region 32 and the drain region 33, and gate electrodes 31 are formed above the channel regions. A source wiring 32a is formed on the gate electrodes 31 and the source regions 32 in a region of the NMOS transistor 30. The source wiring 32a electrically connects the gate electrodes 31, the source regions 32, and a ground terminal. A drain wiring 33a is formed on the drain regions 33 in the region of the NMOS transistor 30 but is not formed on the gate electrodes 31. The drain wiring 33a electrically connects the drain regions 33 and a pad 20 (FIG. 2) serving as an external connection electrode. Moreover, in the region of the NMOS transistor 30, the drain wiring 33a has the same wiring width as the source wiring 32a, and contacts 34 are arranged on both of the wirings in the same manner. In this case, the source region, the source wiring, the drain region, and the drain wiring that sandwich one gate electrode are referred to as one finger. Further, the NMOS transistor 30 is formed by alternately continuously arranging the fingers each being folded.

Figure 2:
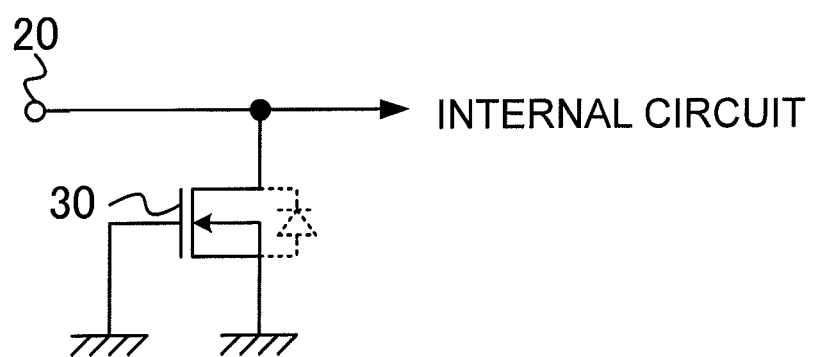
FIG. 2 is a circuit diagram for illustrating the ESD protection circuit in the semiconductor device.

Next, an ESD protection operation of the NMOS transistor 30 is described. FIG. 2 is a circuit diagram for illustrating the ESD protection circuit of the semiconductor device.

The NMOS transistor 30 is designed so that when a surge voltage is applied to the pad 20, a surge current flows from the pad 20 to the ground terminal through the ESD protection circuit. At this time, the NMOS transistor 30 causes the surge current to flow from the drain to the source through a bipolar operation triggered by surface breakdown, and hence the surge current flows through the NMOS transistor 30 but does not flow through the internal circuit. In this manner, the internal circuit is protected against the surge current.

Figure 3:
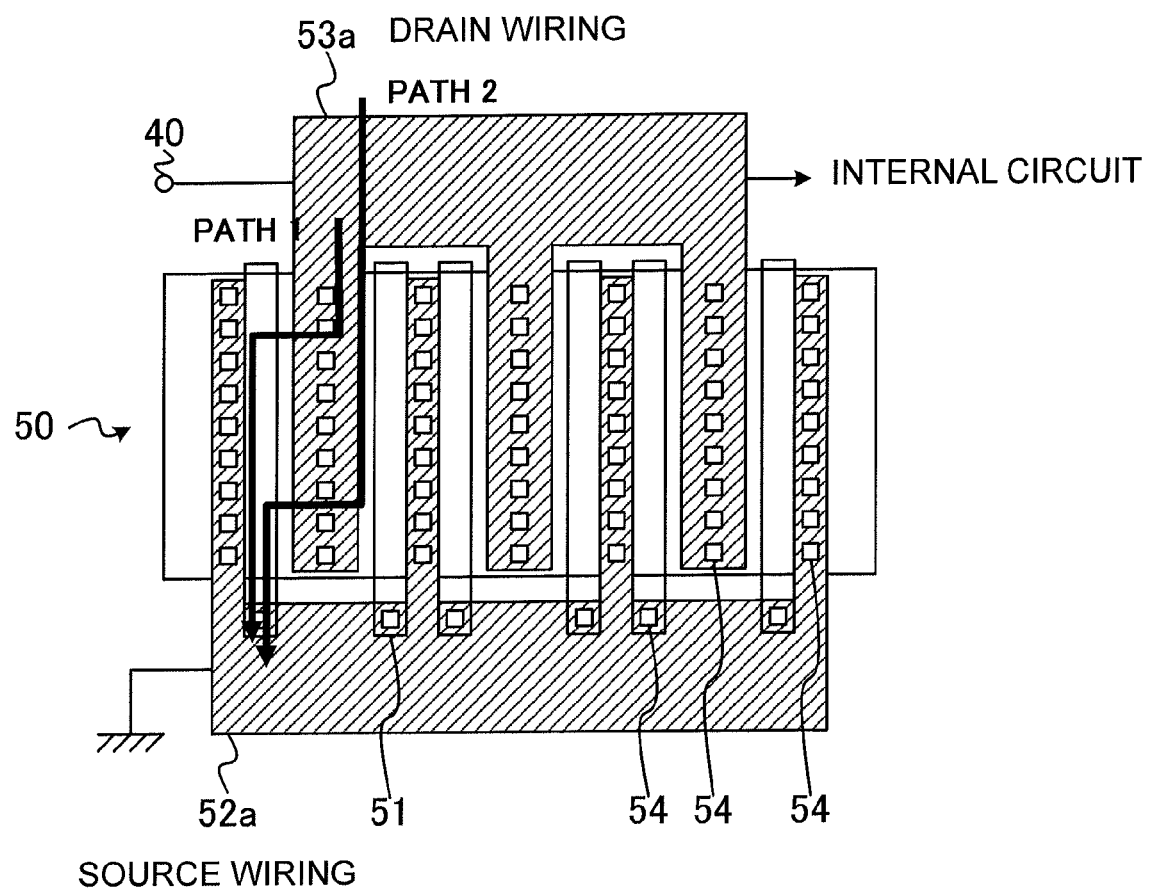
FIG. 3 is a plan view for illustrating a related-art ESD protection circuit using an NMOS transistor in a semiconductor device.
Figure 4:
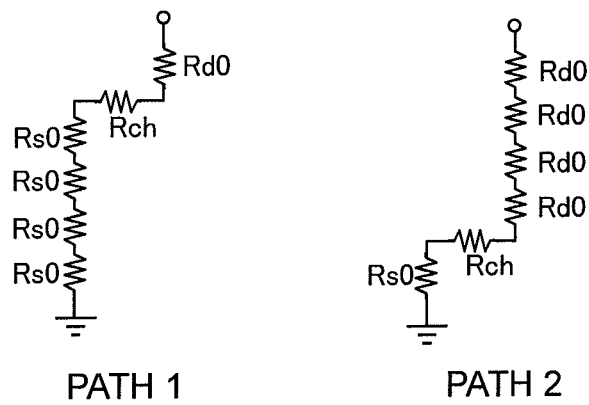
FIG. 4 is an equivalent circuit diagram of a divided NMOS transistor.

At this time, the surge current flows through a resistor of the drain wiring 33a, a resistor of the channel region below the gates 31, and a resistor of the source wiring 32a in this order. Also in FIG. 1, similarly to the case of FIG. 3, one finger of the NMOS transistor 30 is equally-divided into five in a channel width direction, and a resistance of the drain wiring 33a, a resistance of the channel region, and a resistance of the source wiring in each of the divided regions are respectively represented by Rd0, Rch, and Rs0. Then, resistance components of the path 1 and the path 2 can be expressed as follows and can be expressed by equivalent circuits of the divided NMOS transistor illustrated in FIG. 4 similarly to the example of the related art.

Resistance component of path 1=1$Rd0$+$Rch$+4$Rs0$

Resistance component of path 2=4$Rd0$+$Rch$+1$Rs0$

However, as illustrated in FIG. 1, in the region of the NMOS transistor 30, a layout design is made so that the wiring width of the drain wiring 53a and the wiring width of the source wiring 52a are the same, and the contacts 34 are arranged in the same manner. Accordingly, "Rd0=Rs0" is established, and hence "resistance component of path 1=resistance component of path 2" is established.

In other words, all of the equally-divided portions have the same resistance. When the resistance is evenly distributed, regardless of which channel region the surge current flows through in one finger of the NMOS transistor 30, the same total value of the resistance of the wiring is to be applied to the surge current from the pad 20 to the ground terminal. Then, the surge current is not concentrated on a certain portion in the channel region. Thus, there is less risk that the channel region is broken around the certain portion, which leads to high ESD tolerances of the NMOS transistor 30 and the semiconductor device.

Moreover, in order to avoid an increase in element size and a reduction in ESD tolerance, the source wiring 32a is formed not only on the source region 32 but also on the gate electrode 31. As described above, the parasitic resistances are set to be the same, and hence setting the wiring widths of the drain wiring 33a and the source wiring 32a to be the same contributes to the improvement of the ESD tolerance. However, even when those wiring widths are the same, the wirings are melted due to the surge current if the wiring widths are too small, which reduces the ESD tolerance. Therefore, the drain wiring 33a and the source wiring 32a ideally have at least the same wiring width as the drain region 33. However, the source region 32, which has the width smaller than the width of the drain region 33, is too small to arrange thereon the source wiring 32a having the same width as the drain region 33. As one solution for this, it is conceivable to set the width of the source region 32 to be the same as the width of the drain region 33. In this case, however, the element size is increased to increase the chip size. In order to cope with this, instead of expanding the source region 32, the source wiring 32a is formed also on the gate electrode 31, thereby being capable of avoiding an increase in element size and a reduction in ESD tolerance.

REFERENCE SIGNS LIST

30 NMOS transistor
31 gate
32 source
33 drain
32a source wiring
33a drain wiring
34 contact
20 pad
Rs parasitic resistance of source wiring
Rd parasitic resistance of drain wiring
Rch parasitic resistance of channel region

The invention claimed is:
1. A semiconductor device, comprising:
a multi-finger NMOS transistor formed by combining fingers having a same shape, the multi-finger NMOS transistor comprising:
  a plurality of source regions and a plurality of drain regions alternately arranged on a surface of a semiconductor substrate;
  a plurality of channel regions each arranged between one of the plurality of source regions and one of the plurality of drain regions; and
  a gate electrode formed above each of the plurality of channel regions;
a source wiring formed on the gate electrode and the plurality of source regions in a region of the multi-finger NMOS transistor, for electrically connecting the gate electrode, the plurality of source regions, and a ground terminal; and
a drain wiring formed on the plurality of drain regions in the region of the multi-finger NMOS transistor, for electrically connecting the plurality of drain regions and a pad serving as an external connection electrode, each of the fingers of the multi-finger NMOS transistor having a same resistance value when equally-divided in a channel width direction.

2. A semiconductor device according to claim 1, wherein the source wiring and the drain wiring have a same width in each of the fingers.

* * * * *

UNITED STATES PATENT AND TRADEMARK OFFICE
CERTIFICATE OF CORRECTION

PATENT NO. : 9,343,457 B2
APPLICATION NO. : 14/771547
DATED : May 17, 2016
INVENTOR(S) : Tomomitsu Risaki It is certified that error appears in the above-identified patent and that said Letters Patent is hereby corrected as shown below:

On the title page, item (73), the spelling of assignee's name

"STI Semiconductor Corporation"

should be changed to

--SII Semiconductor Corporation--

Signed and Sealed this
Twelfth Day of July, 2016

Michelle K. Lee
*Director of the United States Patent and Trademark Office*